United States Patent [19]

Hanakata

[11] 4,070,587
[45] Jan. 24, 1978

[54] ENERGIZING CONTROL SYSTEM FOR AN INTERMITTENTLY ENERGIZED DEVICE

[75] Inventor: Takayoshi Hanakata, Yokohama, Japan

[73] Assignee: Canon Kabushiki Kaisha, Tokyo, Japan

[21] Appl. No.: 668,804

[22] Filed: Mar. 19, 1976

[30] Foreign Application Priority Data

Mar. 25, 1975 Japan .................................. 50-35912
Feb. 24, 1975 Japan .................................. 51-19135

[51] Int. Cl.² ........................................ G01D 15/10
[52] U.S. Cl. .................................. 307/141; 361/190; 346/76 R; 219/216
[58] Field of Search ...................... 219/216; 346/76 R; 307/141, 141 A, 141.8, 265, 266, 273; 317/135 A; 361/153, 190

[56] References Cited

U.S. PATENT DOCUMENTS 3,501,649  3/1970  Webb .................................. 307/273

OTHER PUBLICATIONS

IBM Tech. Disclosure Bulletin, Hong, "Thermal Printer Chip Protection Circuit," vol. 16, No. 5, Oct. 1973, p. 1422.

Primary Examiner—Robert K. Schaefer
Assistant Examiner—Morris Ginsburg
Attorney, Agent, or Firm—Fitzpatrick, Cella, Harper & Scinto

[57] ABSTRACT

A control system for use with a printer device or the like comprises means whereby the time during which a subject to be controlled, such as the thermal head of the printer, is driven may be determined in accordance with the quiescent period of the subject to be controlled.

7 Claims, 6 Drawing Figures

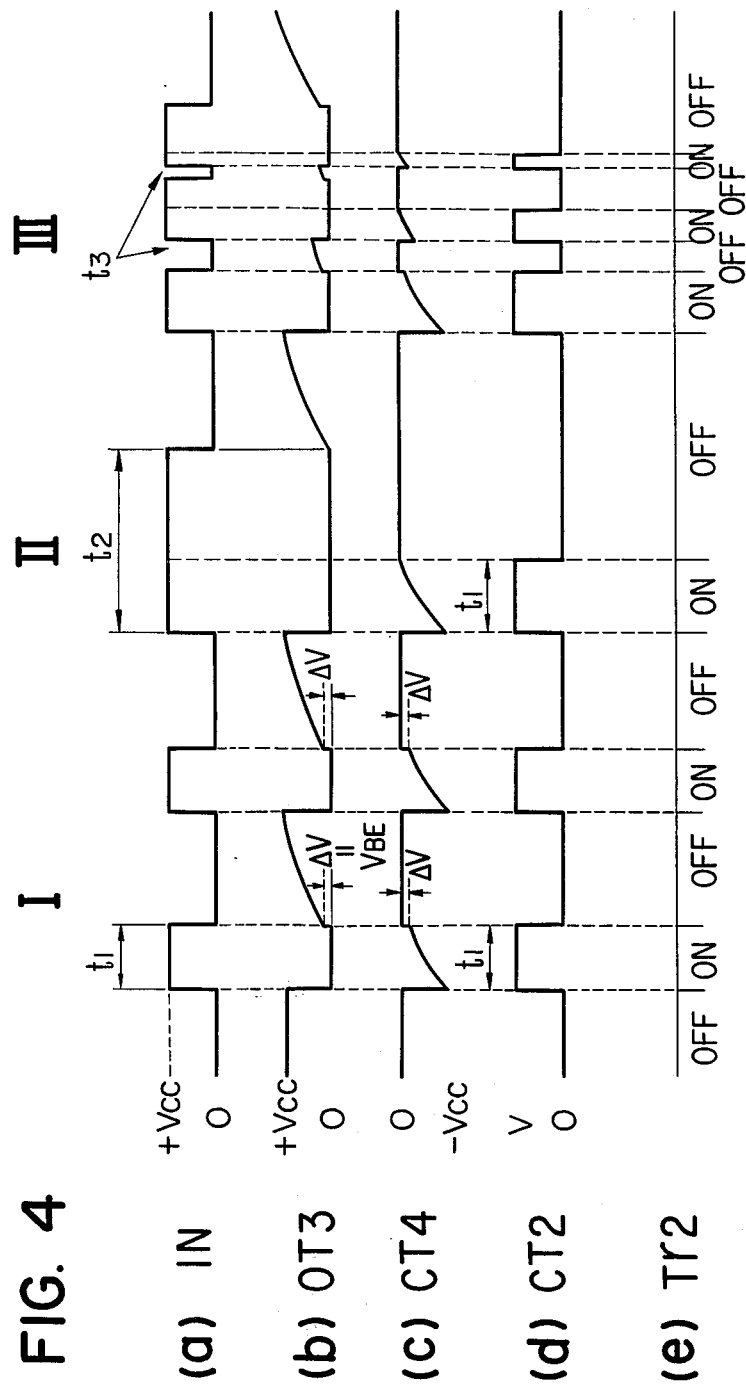
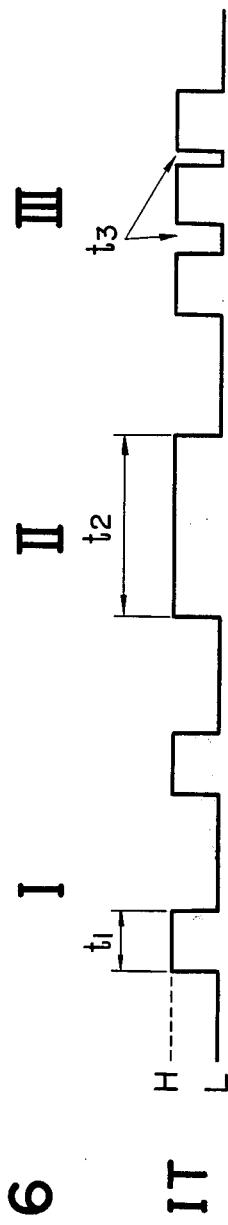
FIG. 4
FIG. 6

ENERGIZING CONTROL SYSTEM FOR AN INTERMITTENTLY ENERGIZED DEVICE

BACKGROUND OF THE INVENTION

1. Field of the Invention

This invention relates to a control system, and more particularly to a control system for efficiently controlling an intermittently energized device.

2. Description of the Prior Art

For example, a printer device for printing characters on recording paper in dot matrix patterns has heretofore effected such character printing with a pulsating current intermittently supplied to printing means thereof such as a thermal head or the like.

The drive control system heretofore provided to energize the printing means in such printer device has been such that the quiescent time of the thermal head is set to a sufficiently great value with respect to the time during which the pulsating current is supplied to the thermal head, thereby preventing the overheating of the thermal head which would result in serious accidents. However, should something be wrong with the print signal or the drive control system to permit a great current to be continuously applied to the thermal head, such head would be burnt out. More seriously, this may further result in destruction of the entire device.

To avoid the occurrence of such accidents, it has heretofore been the practice to provide a temperature fuse adjacent to the thermal head so as to cut off the power supply to the thermal head in an emergency to prevent the expansion of the accident. However, this has only been effective to limit the damage imparted to the subject to be controlled such as thermal head, and has not been perfect in protecting the entire device.

SUMMARY OF THE INVENTION

In view of what has been noted above, it is an object of the present invention to provide a control system which is capable of preventing the overdrive which would otherwise result in accidents.

It is another object of the present invention to provide a control system which is capable of economizing the driving power required.

Generally, the control system according to the present invention may comprise means for determining the time during which a subject to be controlled is driven, in accordance with the quiescent period of the subject to be controlled. The control system may further comprise means for storing a signal corresponding to the quiescent period detected by the detecting means.

Other objects of the present invention will become fully apparent from the following detailed description of some embodiments thereof taken in conjunction with the accompanying drawings.

BRIEF DESCRIPTION OF THE DRAWINGS

FIG. 4 is a signal waveform representation for illustrating the operation of the embodiment shown in FIG. 3.

FIG. 6 is a signal waveform representation for illustrating the operation of the embodiment shown in the block diagram of FIG. 5.

DESCRIPTION OF THE PREFERRED EMBODIMENTS

Figure 1:
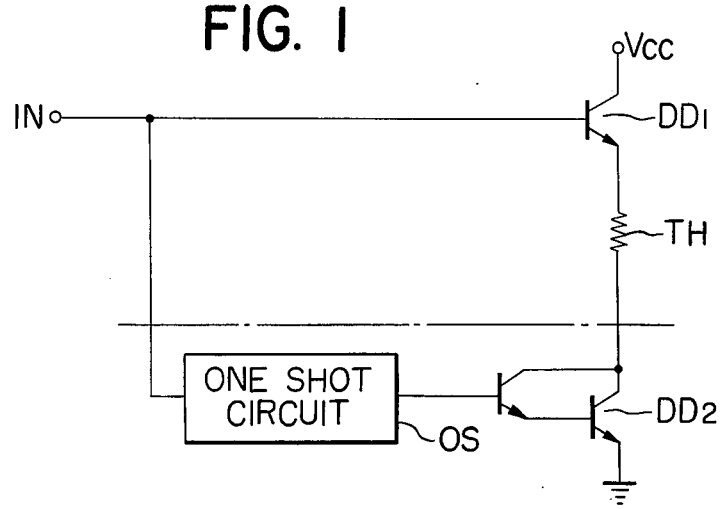
FIG. 1 is a circuit diagram showing an embodiment of the control system according to the present invention.

FIG. 1 is a block diagram showing an embodiment of the control system according to the present invention. In the figure, TH designates a thermal head to be controlled. Upon conduction of switching elements DD1 and DD2, a source voltage Vcc may be applied to the thermal head to record information on recording paper, not shown. The switching element DD1 is designed such that a print command signal directly applied to an input terminal IN is applied to the control terminal of the switching element DD1 for rendering the switching element conductive or non-conductive, and the switching element DD2 is designed such that the output of means such as a one shot ciruit OS, for detecting the print command signal and putting out a signal for rendering the switching element DD2 conductive for a predetermined time, is applied to the control terminal of the switching element DD2.

Figure 2:
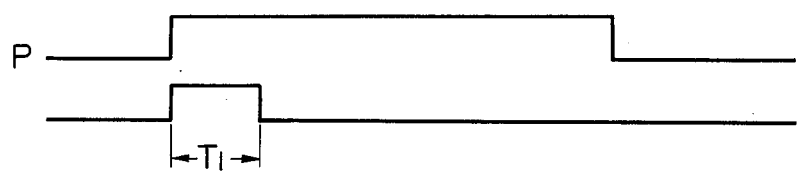
FIG. 2 is a signal waveform representation for illustrating the operation of the embodiment shown in FIG. 1.

Operation of the embodiment constructed as described above will now be described. When the print command signal P as shown in FIG. 2 is supplied directly to the thermal head TH, the thermal head will be burnt out if it is continuously driven. However, when the print command signal P is supplied to the input terminal IN, the switching element DD1 is turned on and off in response to the signal P, while the print command signal P is detected by the one shot circuit OS and the switching element DD2 is rendered conductive for a predetermined time by such detection, so that the time during which the thermal head TH is driven is determined by the time constant of the one shot circuit OS and thus, even if the print signal P applied to the input terminal IN is extended, the thermal head TH will not overwork and may be prevented from overheating.

Figure 3:
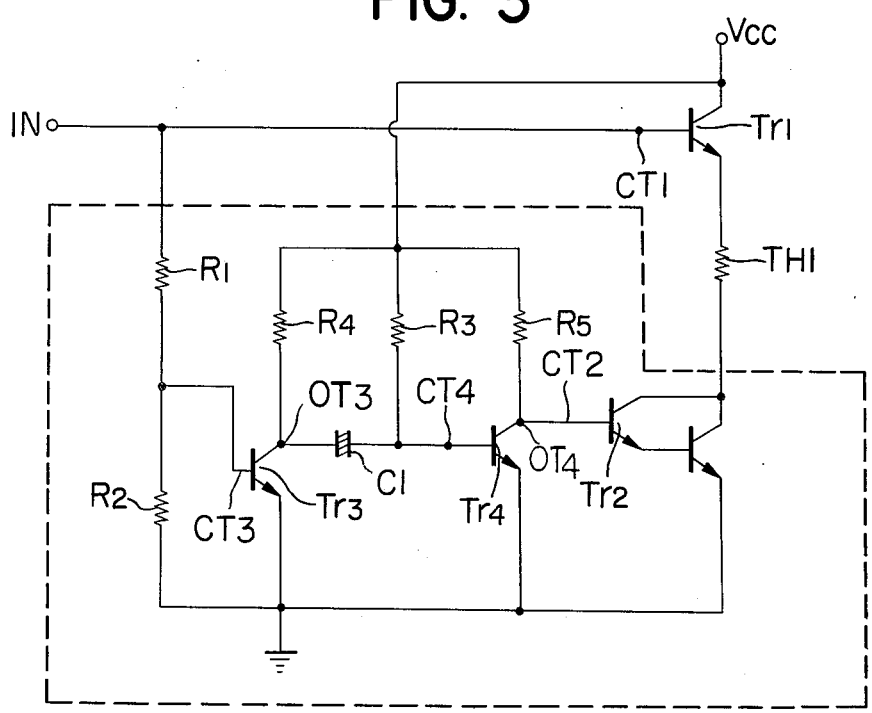
FIG. 3 is a circuit diagram showing another embodiment of the present invention.

FIG. 3 is a circuit diagram showing another embodiment of the control system according to the present invention. In FIG. 3, TH1 designates a thermal head to be controlled which is represented as an electrical equivalent circuit. When transistors Tr1 and Tr2 are turned on at the same time, a voltage Vcc may be supplied to the thermal head TH1 to effect printing on printing paper (not shown) provided in opposed relationship with the thermal head TH1. The transistor Tr1 has its control terminal CT1 directly supplied with a print signal from an input terminal IN and may be turned on and off in response to the print signal, while the transistor Tr2 connected in a Darlington fashion has its control terminal CT2 supplied with the signal applied to the input terminal IN in the manner described below. First, the voltage of the signal supplied to the input terminal IN is divided by resistors R1 and R2, and the divisional signal derived therefrom is in turn supplied to the control terminal CT3 of a transistor Tr3, and then provided as an output from the collector OT3 of the transistor Tr3. The output of the transistor Tr3 is applied to the control terminal of a transistor Tr4 through a differentiation circuit comprising a capacitor C1 and a resistor R3, and the print signal is supplied from the collector OT4 of the transistor Tr4 to the control terminal CT2 of the transistor Tr2.

Operation of the embodiment constructed as described above will be explained by reference to the signal waveforms shown in FIG. 4. When the print signal in its state I having a proper time interval $t_1$ as shown in FIG. 4(a) has been supplied to the input terminal IN, the circuit shown in FIG. 3 operates in the manner described below. When the print signal P is at its low level (herein, zero potential), the divisional voltage output of the resistors R1, R2 for picking up the print signal and passing the signal to the transistor Tr3 is zero and in response thereto, the transistor TR3 is turned off. However, the transistor Tr4 to which the output of the transistor Tr3 is applied through the differentiation circuit comprising the capacitor C1 and resistor R3 is being supplied with a bias current from the voltage source Vcc through the resistor R3 and thus, the transistor Tr4 is turned on. As a result, the connection terminal of the capacitor C1, which is that terminal connected to the collector OT3 of the transistor Tr3, is caused, after a predetermined time, to assume the same potential as the voltage source Vcc by the charge flowing thereto through the resistor R4, while the other terminal of the capacitor C1 assumes the same potential as the base-emitter potential difference $V_{BE}$ of the transistor Tr4. By the transistor Tr4 being turned on, the transistor Tr2 is turned off so that no source voltage is supplied to the thermal head TH1. Subsequently, when the print signal assumes its high level (herein, +Vcc), the transistor TR3 is turned on and that terminal of the capacitor C1 connected to the transistor Tr3 assumes the ground potential as shown in FIG. 4(b), while the other terminal of the capacitor C1 substantially assumes the potential of −Vcc. Thus, the transistor Tr4 is turned off by the reverse bias from the capacitor C1, thereby turning on the transistor Tr2. The transistor Tr1 has also been turned on by that time, so that the source voltage Vcc is supplied to the thermal head TH1, which thus heats. However, the time during which the transistor Tr2 remains turned on is the time during which the charge stored in the capacitor is discharged through the network Vcc→ R3→ C1→ Tr3→ ground which can be realized by the turn-on of the transistor Tr3. Thus, when the charge stored in the capacitor C1 has been discharged through the resistor R4, the transistor Tr4 is again turned on by the bias current flowing through the resistor R3.

More particularly, when the transistor Tr3 has changed from its OFF state to its ON state, the voltage applied to the control terminal CT4 of the transistor Tr4 shifts from $V_{BE}$ to −Vcc as shown in FIG. 4(c), thereby rendering the transistor Tr4 non-conductive as shown in FIG. 4(d). However, since the current from the voltage source Vcc flows to the control terminal CT4 through the resistor R3, the potential at the control terminal CT4 rises exponentially in accordance with the time constant determined by the resistor R3 and capacitor C1. Thus, when such potential has reached $+V_{BE}$, the transistor Tr4 is turned on to cut off the supply of current to the thermal head TH1. Now, when the print signal has assumed its high level in the state II having an abnormally long time interval $t_2$, the transistor Tr2 is turned on only during the discharging time $t_1$ of the capacitor C1 to cause the thermal head TH1 to heat, but during the other time the transistor Tr2 is turned off by the capacitor C1 being charged, thus stopping the thermal head TH1 from heating. Therefore, the thermal head TH1 will never overheat even if an abnormally long signal at the high level is applied thereto.

Next, when a high level print signal is applied in the state III having an abnormally short quiescent time $t_3$, the charge flowing into the capacitor C1 during the shown short quiescent time, namely, during the while the transistor Tr3 is turned off, is reduced because the quantity of the charge stored in the capacitor C1 is proportional to the length of the time during which the print signal is at its low level in a predetermined length of time, and thus, the time during which the transistor Tr4 is turned off in response to the turn-on of the transistor Tr3 becomes very short, and the time during which the transistor Tr2 (indicated in FIG. 4(e)) is turned on in response to the next high level of the print signal becomes so short that the power supplied to the thermal head TH1 is reduced. Thus, the surface temperature of the thermal head is maintained substantially at a predetermined level and therefore, the thermal head TH1 will never overheat even if the print signal is applied thereto at short quiescent time intervals.

While the control system of the present invention has been described with respect to an embodiment for driving a thermal head, it is also applicable to devices for driving solenoids or the like.

Figure 5:
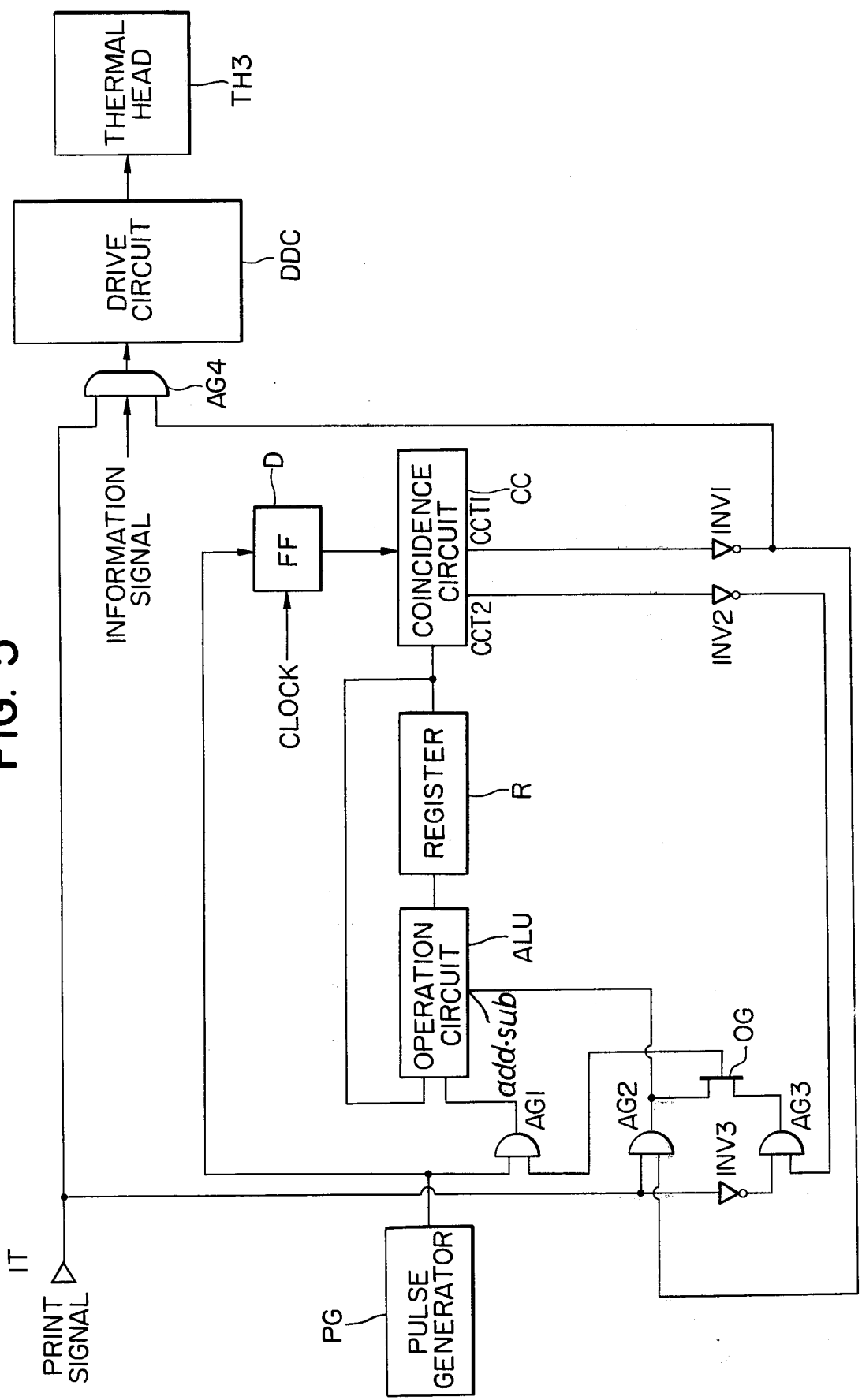
FIG. 5 is a block diagram showing still another embodiment of the present invention.

FIG. 5 is a block diagram showing another embodiment of the control system according to the present invention.

In this figure, IT designates a terminal to which is applied a print command signal coming from a computer or the like. Designated by PG is a pulse generator for generating a pulse having the 1-bit shift time width of a later-described register at a period which is an integral number of times as long as one circulation time of the register. An AND gate AG1 has one input for receiving the pulse from the pulse generator PG and another input for receiving a signal for controlling the opening-closing of the gate.

ALU is an operation circuit for operating the pulse passed through the AND gate AG1, namely, the binary number "1" and the binary number data circulated from the least significant bit of the register. The operation circuit ALU is caused to act as an adder or as a subtractor by a signal applied to its input terminal addsub. R designates a register for serially storing the output from the operation circuit ALU, and the data within the register may be circulated by the clock pulse CP.

CC is a coincidence circuit to which the output from the register R is serially applied and which may comprise, for example, a register having serial inputs and parallel outputs of the same length as the register R and a decoder to which the parallel data of said register is applied. When the parallel data assumes a predetermined value, it is read by the output of a delay flip-flop D for delaying one bit of the pulse from the pulse generator PG and if the parallel data is 0, the terminal CCT1 of the coincidence circuit may put out a high level signal, while the other terminal CCT2 may put out a high level signal if the parallel data assumes a set value. The outputs from the terminals CCT1 and CCT2 are applied through inverters INV1 and INV2 to one input of AND gate AG2 and one input of AND gate AG3, respectively, and may pass through these AND gates AG2 and AG3 to the other input of the AND gate AG1 with the aid of the print command signal applied to the other inputs of these gates directly or through an inverter INV3 to control the opening-closing of the gates, thus permitting or inhibiting application of the signal from the pulse generator PG to the operation circuit ALU. Also, the output of the AND gate AG2 may be applied to the operation circuit ALU, which may act as an adder when said output is at the low level and act as a subtractor when said output at the high level. The output of the terminal CCT1 may also be applied through the inverter INV1 to the input end of the AND gate AG4.

The AND gate AG4 may also receive as inputs the print signal supplied from the input terminal IT and the information signal supplied from a computer to be written on thermosensitive paper (not shown), and the output of such AND gate AG4 may be applied through a decoder drive circuit DDC to the thermal head TH3, which may thus heat to write the information on the thermosensitive paper.

Operation of this embodiment, in response to a high level print signal having a proper time $t_1$ as shown at I in FIG. 6, occurs in the manner described below. First, the register R is cleared by unshown means and, when the print command signal is at its low level, the input terminal IT and the output of the coincidence circuit CC passes a high level signal through the inverters INV3 and INV2 to the AND gate AG3 to change the output thereof to a high level. The AND gate AG2 receives the low level output of the input terminal IT to change the output of this gate to a low level. The circuit ALU receives the low level output of the AND gate AG2 and acts as an adder, while the high level signal from the AND gate AG3 is applied through an OR gate OG to the AND gate AG1, so that the output of the pulse generator PG is applied to one input terminal of the operation circuit ALU, whereupon the operation ciruit ALU and the register R start to measure the time length of the low level of the print command signal. The quantity of the content in the register R is detected by the coincidence circuit CC when the quiescent time, namely, the time length of the low level applied to the input terminal IT has exceeded a predetermined value, whereupon a high level signal is put out from the terminal CCT2 and changed to a low level signal by the inverter INV2, so that the AND gate AG3 changes its output to a low level and closes the AND gate AG1, which thus inhibits the output of the pulse generator PG from being applied to the operation circuit ALU while the coincidence circuit CC continues to put out a high level signal from its output terminal CCT2, thus stopping the data in the register R from varying.

Subsequently, when the print command signal assumes its high level, the output of the terminal CCT1 of the coincidence circuit CC, which is at its low level because the content of the register R is not 0, is changed to a high level through the inverter INV1, and such high level output is passed through the AND gate AG2, which has been opened by the high level of the print command signal, to thereby cause the operation circuit ALU to act as a substractor and also open the AND gate AG1 so as to apply therethrough the output of the pulse generator PG to the operation circuit ALU. As a result, the content of the register R is decreased each time the pulse from the pulse generator PG, namely, the binary signal "1", is applied to the operation circuit ALU. Also, when the high level of the print command signal has been applied to the terminal IT, the other terminal of the AND gate AG4, which is for receiving the output of the terminal CCT1 after it is inverted by the inverter INV1, is supplied with the high level signal, so that the information signal is passed through the AND gate AG4 to the decoder drive circuit DDC. Thus, the thermal head TH3 is driven to write the information on unshown thermosensitive paper in a dot matrix pattern, for example.

The heating time of the thermal head TH3 with respect to the thermosensitive paper is such that when the print command signal arrives with an appropriate length, the content of the register is varied from 0 to a set value during the time of the low level of theprint command signal, whereafter when the print command signal assumes its high level to write information on the recording paper, the content of the register is varied from the set value to 0. The above-described sequence of variations is repeated each time the high level of the print command signal arrives.

When the print command signal applied to the terminal IT assumes the state II in which such signal maintains the high level for a long time, the content stored in the register R during the low level state immediately prior to the arrival of the long high level signal begins to decrease, until the content of the register R becomes 0, whereupon the terminal CCT1 of the coincidence circuit CC puts out a high level signal, which is applied through the inverter INV1 to the gate AG4 to close this gate, thus stopping the thermal head TH3 from being driven and protecting it against long-time drive.

Consideration will now be given to a case where the print command signal which does not have the length of time peculiar to the proper low level state is applied to the terminal IT to drive the thermal head TH3. It has already been noted that the content of the register R is decreased when a low level signal is being applied to the terminal IT. Since, however, the time during which the low level is maintained is short, a high level signal comes to the terminal IT before the content of the register R reaches its set value and therefore, as soon as the high level signal is applied to the terminal IT as described just above, the content of the register R begins to decrease and the output of the inverter INV1 remains at the high level until the content of the register R becomes 0, so that the information signal is supplied to the decoder drive circuit DDC to cause the thermal head TH3 to write the information on recording paper. The time during which the thermal head TH3 writes the information on the recording paper is the time required for the content of the register R to become 0, and the shorter the time of the low level applied to the input terminal IT, the shorter the drive time of the thermal head TH3 when a subsequent high level signal is applied to the terminal IT. Thus, even if a print command signal having a short quiescent time is applied, the thermal head TH3 may be prevented from overheating because the maximum average value of the driving power for the thermal head can be determined by the set value of the coincidence circuit CC.

If digitally constructed as described in connection with the third embodiment, the control system may be formed into an integrated circuit which may in turn lead to a reduced number of system components. Further, a thermal head has been employed as the subject to be controlled, whereas this is not restrictive.

I claim:

1. An energizing control system for a device to be intermittently energized comprising:
   means for intermittently energizing the device;
   means for sensing a quiescent period during which the device is deenergized; and means coupled to said sensing means for controlling the energizing means to energize the device for a period of time determined by the duration of the previous said quiescent period sensed by said sensing means.

2. A device according to claim 1, wherein said device further comprises means for storing a signal corresponding to the sensed quiescent period.

3. A device according to claim 2, wherein said storing means comprises a capacitance circuit.

4. A device according to claim 1, wherein said energizing means applies pulses to energize the device.

5. An energizing control system for a device to be intermittently energized comprising:
- a driving circuit for supplying energizing power to the device in response to a driving instruction signal;
- a detector circuit for detecting said driving instruction signal;
- a memory circuit coupled to said detector circuit for storing a signal corresponding to a time during which the driving instruction signal is not detected by said detector circuit; and
- control circuit means coupled to the memory circuit for determining a next energizing period, during which said energizing power is supplied to the device, in accordance with the signal stored in said memory circuit.

6. A thermal head driving control device comprising:
- a driving circuit for supplying an energizing current to a thermal head;
- a timer circuit for measuring a driving quiescent period of said thermal head; and
- control circuit means coupled to said timer circuit for defining the following driving period of the thermal head in accordance with the driving quiescent period information measured by said timer circuit.

7. An energizing control system for a device to be intermittently energized, comprising:
- a driving circuit for energizing the device, said driving circuit having a switching circuit adapted to turn on upon receipt of a first signal and to turn off upon receipt of a second signal, so that energizing power is applied to the subject when said switching circuit turns on;
- a detecting circuit for detecting a time period during which said switching circuit is turned off in response to a said second signal;
- a memory circuit for storing a signal corresponding to said detected time period; and
- control circuit means coupled to said memory circuit for defining a driving period of the device in accordance with the time period information stored in said memory circuit, when the next said first signal is applied to said switching circuit.

* * * * *